United States Patent
Mikawa et al.

(10) Patent No.: US 6,562,677 B1
(45) Date of Patent: May 13, 2003

(54) CAPACITANCE ELEMENT AND METHOD OF MANUFACTURING THE SAME

(75) Inventors: Takumi Mikawa, Kyoto (JP); Yuji Judai, Kyoto (JP); Yoshihisa Nagano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 287 days.

(21) Appl. No.: 09/689,840

(22) Filed: Oct. 13, 2000

Related U.S. Application Data

(62) Division of application No. 09/109,032, filed on Jul. 2, 1998, now Pat. No. 6,166,424.

(30) Foreign Application Priority Data

Jul. 3, 1997 (JP) .............................................. 9-178133

(51) Int. Cl.⁷ .......................................... H01L 21/8242
(52) U.S. Cl. ....................... 438/239; 438/240; 438/250; 438/957; 438/3; 257/532; 257/535
(58) Field of Search ................................ 438/239, 240, 438/250, 957, 3; 257/535, 532

(56) References Cited

U.S. PATENT DOCUMENTS

| | | | |
|---|---|---|---|
| 5,036,020 A | 7/1991 | Tigelaar | |
| 5,539,613 A | 7/1996 | Shintaro et al. | |
| 5,567,964 A | * 10/1996 | Kashihara et al. | 257/310 |
| 5,693,553 A | * 12/1997 | Kashiihara et al. | 438/240 |
| 5,717,233 A | 2/1998 | Fuji et al. | |
| 5,789,303 A | * 8/1998 | Leung | 438/240 |

FOREIGN PATENT DOCUMENTS

| | | |
|---|---|---|
| JP | 2-187061 | 7/1990 |
| JP | 5-129522 | 5/1993 |
| JP | 6-061424 | 3/1994 |
| JP | 07094600 | 4/1995 |
| WO | 96/17386 | 6/1996 |

* cited by examiner

*Primary Examiner*—Matthew Smith
*Assistant Examiner*—B V. Keshavan
(74) *Attorney, Agent, or Firm*—McDermott, Will & Emery

(57) ABSTRACT

On a substrate, there are provided a lower electrode, a capacitance insulating film, a passivation insulating film, and a first partial film of an upper electrode to be filled in a second aperture (capacitance determining aperture) formed in the passivation insulating film. The lower electrode, the capacitance insulating film, and the first partial film constitute a capacitance element. The upper electrode has the first partial film which is in contact with the capacitance insulating film and a second partial film which is not in contact with the capacitance insulating film. Since a second electrode wire consisting of a lower-layer film composed of titanium and an upper-layer film composed of an aluminum alloy film is in contact with the second partial film distinct from the first partial film of the upper electrode, titanium or the like encroaching from the second electrode wire can be prevented from diffusing into the capacitance insulating film.

8 Claims, 10 Drawing Sheets

1 SUBSTRATE
2 LOWER ELECTRODE
3 CAPACITANCE INSULATING FILM
4 FIRST APERTURE
5 PASSIVATION INSULATING FILM
6 SECOND APERTURE (CAPACITANCE DETERMINING APERTURE)
7 UPPER ELECTRODE
7a FIRST PARTIAL FILM
7b SECOND PARTIAL FILM
8 INTERLAYER INSULATING FILM
9a FIRST CONTACT HOLE
9b SECOND CONTACT HOLE
10 FIRST ELECTRODE WIRE
10a LOWER-LAYER FILM
10b UPPER-LAYER FILM
11 SECOND ELECTRODE WIRE
11a LOWER-LAYER FILM
11b UPPER-LAYER FILM

Fig. 1

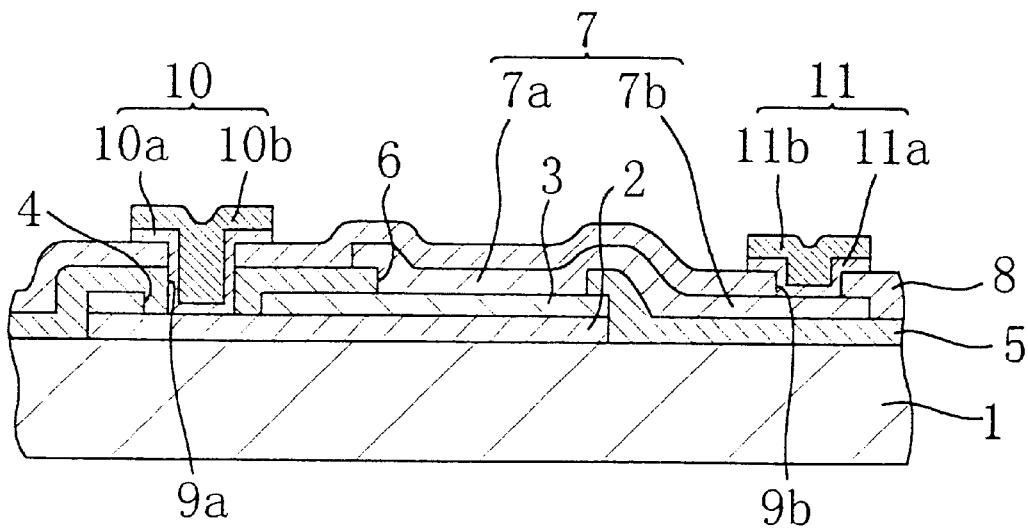

1 SUBSTRATE
2 LOWER ELECTRODE
3 CAPACITANCE INSULATING FILM
4 FIRST APERTURE
5 PASSIVATION INSULATING FILM
6 SECOND APERTURE (CAPACITANCE DETERMINING APERTURE)
7 UPPER ELECTRODE
7a FIRST PARTIAL FILM
7b SECOND PARTIAL FILM
8 INTERLAYER INSULATING FILM
9a FIRST CONTACT HOLE
9b SECOND CONTACT HOLE
10 FIRST ELECTRODE WIRE
10a LOWER-LAYER FILM
10b UPPER-LAYER FILM
11 SECOND ELECTRODE WIRE
11a LOWER-LAYER FILM
11b UPPER-LAYER FILM

1 SUBSTRATE
2 LOWER ELECTRODE
3 CAPACITANCE INSULATING FILM
4 FIRST APERTURE
7 UPPER ELECTRODE
7a FIRST PARTIAL FILM
7b SECOND PARTIAL FILM
8 INTERLAYER INSULATING FILM
9a FIRST CONTACT HOLE
9b SECOND CONTACT HOLE
10 FIRST ELECTRODE WIRE
10a LOWER-LAYER FILM
10b UPPER-LAYER FILM
11 SECOND ELECTRODE WIRE
11a LOWER-LAYER FILM
11b UPPER-LAYER FILM
12 INSULATOR SIDEWALL

CAPACITANCE ELEMENT AND METHOD OF MANUFACTURING THE SAME

This application is a Divisional of application Ser. No. 09/109,032 filed Jul. 2, 1998, now U.S. Pat. No. 6,166,424.

BACKGROUND OF THE INVENTION

The present invention relates to a capacitance element using a capacitance insulating film made of a dielectric material with a high dielectric constant or of a ferroelectric material and to a manufacturing method therefor.

As higher-speed and lower-power microcomputers have been implemented in recent years, electronic devices to be used as consumer products have remarkably increased in performance, while semiconductor elements composing a semiconductor device used therein have been rapidly scaled down. Under such circumstances, undesired radiation which is electromagnetic noise generated from the electronic devices has presented a serious problem. As a measure to suppress the undesired radiation, attention has been focused on the technique of embedding, in a semiconductor integrated circuit or the like, a capacitance element with large capacitance using a capacitance insulating film made of a dielectric material with a high dielectric constant (hereinafter simply referred to as a high-dielectric-constant material). As higher integration has been achieved in a dynamic RAM, on the other hand, extensive research has been conducted on the technique of using a high-dielectric-constant film as a replacement for a silicon oxide film or silicon nitride film that has been used previously. Additionally, vigorous research and development has been directed toward a ferroelectric film having the property of spontaneous polarization to implement an industrially usable non-volatile RAM capable of operating at low voltage and performing high-speed writing and reading operations.

To implement a semiconductor device having the performance described above, it is important to devise a capacitance element having such a structure as to allow higher integration without degrading the properties of the capacitance element and a manufacturing method therefor.

Referring to the drawings, a conventional capacitance element and a manufacturing method therefor will be described. FIG. 9 is a cross-sectional view of a principal portion of the conventional capacitance element, in which are shown: a substrate such as a silicon substrate with an integrated circuit formed therein; a lower electrode 22 of the capacitance element which is composed of a platinum film or the like; a capacitance insulating film 23 of the capacitance element which is composed of a thin ferroelectric film; and an upper electrode 24 of the capacitance element which is composed of a platinum film or the like. The upper and lower electrode 24 and 22 and the capacitance insulating film 23 constitute the capacitance element. There are also shown: an aperture 25 formed in the capacitance insulating film 24; an interlayer insulating film 26 covering the capacitance element; a first contact hole 27 extending through the interlayer insulating film 26 to reach the lower electrode 22; a second contact hole 28 extending through the interlayer insulating film 26 to reach the upper electrode 24; a first electrode wire 29 to be connected to the lower electrode 22; and a second electrode wire 30 to be connected to the upper electrode 24.

The recent trend has been to compose each of the electrode wires 29 and 30 of a multilayer film such as a two-layer film consisting of an upper-layer aluminum-alloy film containing aluminum as a main component and a lower-layer titanium film or a three-layer film consisting of an upper-layer aluminum-alloy film containing aluminum as a main component, an interlayer titanium nitride film, and a lower-layer titanium film. In the case of embedding such a capacitance element in an integrated circuit, in particular, the first and second electrode wires 29 and 30 are also connected directly to a diffusion region in the integrated circuit, so that the titanium film is normally used to compose the lowermost layer of the multilayer film, thereby lowering contact resistance between the diffusion region and the aluminum alloy film.

Next, a description will be given to the manufacturing method for the conventional capacitance element. FIGS. 10(a) to 10(e) are cross-sectional views illustrating the process of manufacturing the conventional capacitance element.

First, in the step shown in FIG. 10(a), a first platinum film 22a, a ferroelectric film 23a, and a second platinum film 24a are formed sequentially on the substrate 21. Next, in the step shown in FIG. 10(b), the second platinum film 24a is patterned by using a photoresist mask to form the upper electrode 24. Next, in the step shown in FIG. 10(c), the dielectric film 23a is patterned by using a photoresist mask covering a region including the upper electrode 24 to form the capacitance insulating film 23 having the aperture 25. Furthermore, the first platinum film 22a is etched selectively by using a photoresist mask covering the upper electrode 24, the capacitance insulating film 23, and the aperture 25 to form the lower electrode 22.

Next, in the step shown in FIG. 10(d), the interlayer insulating film 26 is formed on the substrate, followed by the first contact hole 27 formed to extend through the interlayer insulating film 26 to reach the lower electrode 22 and the second contact hole 28 formed to extend through the interlayer insulating film 26 to reach the upper electrode 25.

Next, in the step shown in FIG. 10(e), the titanium film and the aluminum alloy film are deposited over the entire surface of the substrate. The titanium film and the aluminum alloy film are then patterned by using a photoresist mask covering the contact holes 27 and 28 and their surroundings to form the first electrode wire 29 to be connected to the lower electrode 22 and the second electrode wire 30 to be connected to the upper electrode 24.

Although each of the first and second electrode wires 29 and 30 is shown as a single-layer film in FIG. 10(e) for the sake of simplicity, it is typically composed of a multilayer film such as the two-layer film consisting of the aluminum alloy film and the titanium film or the three-layer film consisting of the aluminum alloy film, the titanium nitride film, and the titanium film as described above.

In the conventional capacitance element, excellent adhesion is required between the second electrode wire 30 and the upper electrode 24. Moreover, since the capacitance insulating film 23 is typically composed of a ferroelectric material containing a metal oxide as a main component, the platinum film is used to compose each of the upper and lower electrodes 24 and 22 as a material which is unreactive to the metal oxide and capable of withstanding high temperature during thermal treatment. Furthermore, the titanium layer is interposed between the aluminum layer and the platinum layer to compose each of the electrode wires 29 and 30 due to poor adhesion between the aluminum layer and the platinum layer, thereby solidifying the connection between the electrode wires and the electrodes of the capacitance element.

To improve the performance of the capacitance element, thermal treatment is indispensably performed after the formation of the electrode wires 29 and 30 in the manufacturing process. After the heat treatment was performed with respect to the electrode wires 29 and 30, however, the phenomenon was observed in which the performance of the ferroelectric film composing the capacitance insulating film 23 was degraded.

The cause of the degraded performance was tracked down and presumed as follows. The platinum film composing each of the upper and lower electrodes 24 and 22 of the capacitance element has a columnar crystal structure since it is normally formed by sputtering. During the thermal treatment performed with respect to the electrode wires 29 and 30, titanium composing the lower layer of the second electrode wire 30 diffuses into the capacitance insulating film 23 through the grain boundary of the columnar crystal in the platinum film composing the upper electrode 24 to react with the ferroelectric film composing the capacitance insulating film 23, which is the presumed cause of the degraded performance.

The foregoing problem may occur not only in the case where each of the electrodes of the capacitance element is composed of the platinum film but also in the case where it is composed of iridium, palladium, ruthenium, or the like. Even when the lower electrode is composed of a polysilicon film as in a storage node of a memory cell transistor in a DRAM, a similar problem occurs provided that the upper electrode is composed of platinum or the like.

SUMMARY OF THE INVENTION

It is therefore an object of the present invention to provide a capacitance element having such a structure that metal composing an electrode is prevented from diffusing into a capacitance insulating film and a manufacturing method therefor, thereby positively preventing the degradation of the properties of the capacitance insulating film, while maintaining excellent adhesion between an upper electrode and an electrode wire.

To attain the object, the present invention has formed an upper electrode having a part kept from contact with a capacitance insulating film such that connection is achieved between the part of the upper electrode and the electrode wire.

A capacitance element according to the present invention comprises: a substrate; a lower electrode composed of a conductor film formed on the substrate; a capacitance insulating film formed on the lower electrode; an upper electrode composed of a metal material and having a first partial film which is in contact with a top surface of the capacitance insulating film and a second partial film which is not in contact with the capacitance insulating film; an interlayer insulating film covering at least the upper electrode; a contact hole extending through the interlayer insulating film and reaching the second partial film of the upper electrode; and an electrode wire filled in at least the contact hole and connected to the upper electrode.

In the arrangement, the second partial film which is not in contact with the capacitance insulating film provides connection between the upper electrode and the electrode wire. This minimizes the possibility that a materiel composing the electrode wire encroaches from the first partial film of the upper electrode into the capacitance insulating film during thermal treatment in the manufacturing process.

In the capacitance element, the second partial film of the upper electrode may have a region in non-overlapping relation with the capacitance insulating film when viewed in plan view and the electrode wire may be connected to the upper electrode at the region of the second partial film in non-overlapping relation with the capacitance insulating film.

The arrangement increases the distance between the second partial film and the capacitance insulating film and more positively prevents the material composing the electrode wire from encroaching from the first partial film of the upper electrode into the capacitance insulating film during thermal treatment in the manufacturing process.

In the capacitance element, the upper electrode may also be formed to be in contact with only a part of the capacitance insulating film, the capacitance element further comprising an underlying insulating film covering at least a part of a region of the capacitance insulating film which is not in contact with the upper electrode, the second partial film of the upper electrode having a region in overlapping relation with the capacitance insulating film when viewed in plan view over the underlying insulating film, the electrode wire being connected to the upper electrode at the region of the second partial film in overlapping relation with the capacitance insulating film when viewed in plan view.

This allows a reduction in the area occupied by the whole capacitance element and further miniaturization of the capacitance element.

In the capacitance element, the capacitance insulating film may also be formed to have substantially the same outer circumferential configuration as the lower electrode, the capacitance element further comprising insulator sidewalls formed on respective side faces of respective outer circumferential portions of the capacitance insulating film and the lower electrode.

In the arrangement, the first and second partial films of the upper electrode are formed continually to present a smoothly curved contour over the capacitance insulating film and the insulator sidewalls in vertical cross section. This suppresses the occurrence of a failure due to discontinuation of the metal film composing the upper electrode at the end portion of the capacitance insulating film.

The capacitance element may further comprise: a capacitance-determining insulating film covering a region of the capacitance insulating film along an outer circumference thereof; and a capacitance determining aperture formed in a region of the capacitance-determining insulating film positioned above a main region of the capacitance insulating film except for the region along the outer circumference thereof, the first partial film of the upper electrode being formed in the capacitance determining aperture.

In the arrangement, the region of the capacitance insulating film in the vicinity of the outer circumference thereof which is susceptible to an influence exerted by peripheral members does not function as a part of the capacitance element, which allows the capacitance element to retain particularly excellent properties and have an accurate capacitance value.

Preferably, a metal material composing the upper electrode includes at least any one of platinum, iridium, palladium, and ruthenium.

Preferably, the upper electrode is composed of at least any two of a platinum film, an iridium film, a palladium film, and a ruthenium film, the two films being stacked in layers.

Preferably, the upper electrode has a columnar crystal structure perpendicular to an underlying surface.

In the arrangement, the metal film composing the upper electrode contains no grain boundary extending in parallel with a film surface thereof, so that a material composing the electrode wire is surely prevented from diffusing from the first partial film into the metal film, reaching the second partial film, and further encroaching in the capacitance insulating film.

Preferably, the capacitance insulating film is composed of any one of a first oxide containing any one of strontium, bismus, and tantalum as a main component, a second oxide containing any one of lead, zircon, and titanium as a main component, and a composite of the first and second oxides.

This suppresses the generation of undesired radiation from an electronic device on which the capacitance element is to be mounted and implements a capacitance element having large capacitance and occupying a minimized area even when it is disposed in a memory cell of a DRAM or non-volatile RAM.

A first method of manufacturing a capacitance element according to the present invention comprises: a first step of sequentially forming a conductor film and a dielectric film on a substrate; a second step of patterning the conductor film and the dielectric film to form a lower electrode and a capacitance insulating film; a third step of forming a metal film for an upper electrode on the substrate; a fourth step of patterning the metal film for an upper electrode to form an upper electrode having a first partial film which is in contact with a top surface of the capacitance insulating film and a second partial film which is not in contact with the capacitance insulating film; a fifth step of forming an interlayer insulating film on the substrate; a sixth step of forming a contact hole extending through the interlayer insulating film and reaching the second partial film of the upper electrode; and a seventh step of depositing a metal film for a wire on the substrate and patterning the metal film for a wire to form an electrode wire filled in the contact hole and connected to the second partial film of the upper electrode.

In the first method of manufacturing a capacitance element, the second step may include etching the conductor film and the dielectric film by using a common mask member to form the lower electrode and the capacitance insulting film having substantially the same outer circumferential configuration as the lower electrode, the method further comprising the step of depositing an insulating film for sidewalls on the substrate and performing anisotropic etching with respect to the insulating film for sidewalls to form insulator sidewalls on respective end faces of respective outer circumferential portions of the capacitance insulating film and the lower electrode, wherein the fourth step may include forming the second partial film of the upper electrode over a region of the substrate including the insulator sidewalls.

A second method of manufacturing a capacitance element according to the present invention comprises: a first step of sequentially forming a conductor film and a dielectric film on a substrate; a second step of patterning the conductor film and the dielectric film to form a lower electrode and a capacitance insulating film; a third step of forming an underlying insulating film on the substrate; a fourth step of partially removing the underlying insulating film to expose a part of the capacitance insulating film; a fifth step of forming a metal film for an upper electrode on the substrate; a sixth step of patterning the metal film for an upper electrode to form an upper electrode having a first partial film which is in contact with a top surface of the exposed region of the capacitance insulating film; a seventh step of forming an interlayer insulating film on the substrate; an eighth step of forming a contact hole extending through the interlayer insulating film and reaching the second partial film of the upper electrode; and a ninth step of depositing a metal film for a wire on the substrate and patterning the metal film for a wire to form an electrode wire filled in the contact hole and connected to the second partial film of the upper electrode.

In the second method of manufacturing a capacitance element, the fourth step may include removing a region of the underlying insulating film positioned above a main region of the capacitance insulating film except for a region of the capacitance insulating film in the vicinity of an outer circumference thereof to form a capacitance determining aperture and the sixth step may include forming the second partial film of the upper electrode in the capacitance determining aperture.

In the second method of manufacturing a capacitance element, the sixth step may include forming the second partial film of the upper electrode on a region of the substrate in non-overlapping relation with the capacitance insulating film.

In the second method of manufacturing a capacitance element, the sixth step may include forming the second partial film of the upper electrode on a region of the underlying insulating film in overlapping relation with the capacitance insulating film.

The first and second methods of manufacturing a capacitance element allows the formation of a capacitance element comprising the capacitance insulating film which is not in contact with the second partial film of the upper electrode which is in contact with the electrode wire. What results is a method of manufacturing a capacitance element having the function of preventing a material composing the metal film for an electrode wire from encroaching into the capacitance insulating film.

In the first and second methods of manufacturing a capacitance element, the step of forming the metal film for an upper electrode is preferably performed by sputtering.

In accordance with the methods, each of the first and second partial films of the upper electrode is formed of the metal film having a columnar structure extending perpendicularly to a film surface. This allows easy formation of the capacitance element wherein the metal film composing the upper electrode contains no grain boundary extending in parallel with a film surface thereof and a material composing the metal film for an electrode wire is surely prevented from encroaching into the capacitance insulating film.

BRIEF DESCRIPTION OF THE DRAWINGS

FIG. 1 is a cross-sectional view showing a structure in the vicinity of a capacitance element according to a first embodiment;

DETAILED DESCRIPTION OF THE INVENTION

Embodiment 1

Figure 2:
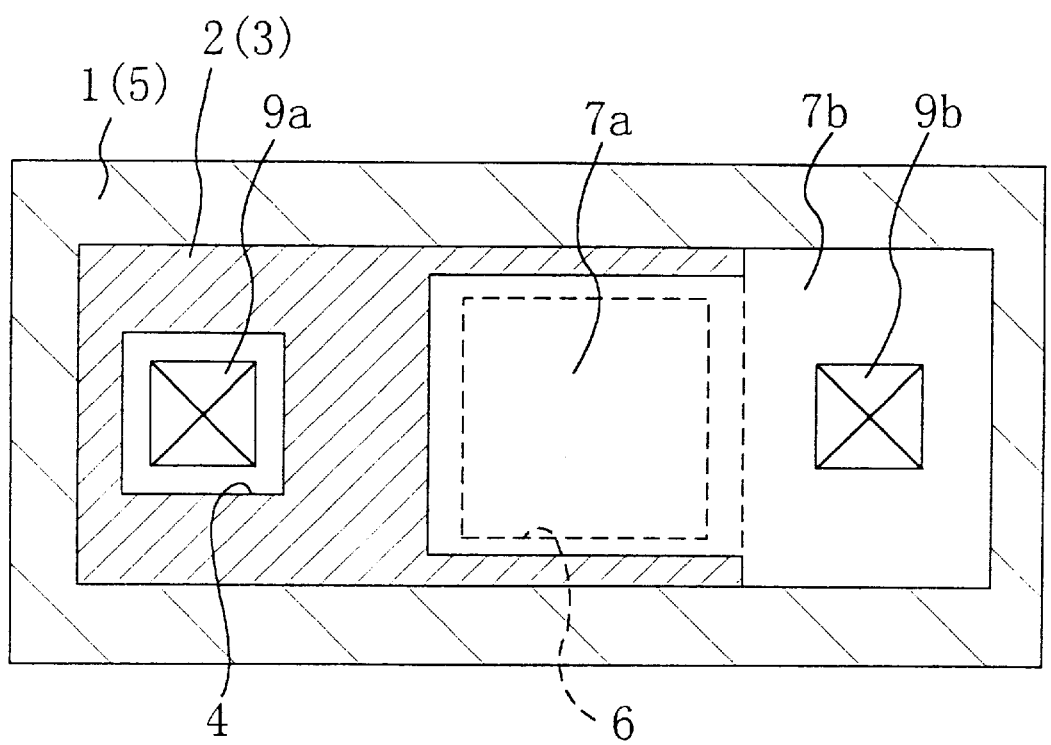
FIG. 2 is a plan view showing the structure in the vicinity of the capacitance element according to the first embodiment.

FIGS. 1 and 2 are a cross-sectional view and a plan view each showing a principal portion of a capacitance element according to a first embodiment of the present invention. It is to be noted that the drawing of an interlayer insulating film and electrode wires is omitted in FIG. 2. A lower electrode 2 is formed on a substrate 1 (such as a silicon substrate). A capacitance insulating film 3 is formed on the lower electrode 2. The capacitance insulating film 3 is formed with a first aperture 4 reaching the lower electrode 2. A passivation insulating film 5 is formed on the capacitance insulating film 3. The passivation insulating film 5 is formed with a second aperture (capacitance determining aperture) 6 reaching the capacitance insulating film 3. A first partial film 7a of an upper electrode 7 is formed to fill in the second aperture 6. The lower electrode 2, the capacitance insulating film 3, and the first partial film 7a in the second aperture 6 constitute a MIM capacitance element. In the present embodiment, the passivation insulating film 5 functions as a capacitance-determining insulating film for determining the capacitance of the capacitance element.

A second partial film 7b of the upper electrode 7 is provided on the passivation insulating film 5. The second partial film 7b is formed in the region where it is kept from contact with the capacitance insulating film 3 and extends continually from the first partial film 7a filled in the second aperture 6. In particular, the second partial film 7b according to the present embodiment has a region in non-overlapping relation with the capacitance insulating film when viewed in plan view. An interlayer insulating film 8 is formed over the first and second partial films 7a and 7b to cover the whole substrate. A first contact hole 9a is formed through the interlayer insulating film 8 and the passivation insulating film 5 filled in the first aperture 4 to reach the lower electrode 2. A second contact hole 9b is formed through the interlayer insulating film 8 to reach the region of the second partial film 7b in non-overlapping relation with the capacitance insulating film when viewed in plan view. A first electrode wire 10 is formed in the first contact hole 9a and on the portion of the interlayer insulating film 8 surrounding the first contact hole 9a. A second electrode wire 11 is formed in the second contact hole 9b and on the portion of the interlayer insulating film 8 surrounding the second contact hole 9b. The first and second electrode wires 10 and 11 are composed of respective two-layer films consisting of respective lower-layer films 10a and 11a each made of titanium and respective upper-layer films 10b and 11b each made of an aluminum alloy film 3.

It follows therefore that, in the capacitance element according to the present embodiment, the second electrode wire 11 is connected to the region of the second partial film 7b of the upper electrode 7 in non-overlapping relation with the capacitance insulating film.

A description will be given next to the process of manufacturing the capacitance element having the structure shown in FIGS. 1 and 2. FIGS. 3(a) to 3(f) are cross-sectional views illustrating the process steps of manufacturing the capacitance element according to the first embodiment.

Figure 3A:
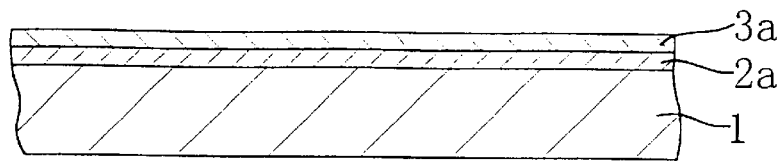
FIGS. 3(a) to 3(f) are cross-sectional views illustrating the process of manufacturing the capacitance element according to the first embodiment.

First, in the step shown in FIG. 3(a), a first metal film 2a and a dielectric film 3a are formed on the main surface of the substrate 1.

Figure 3B:
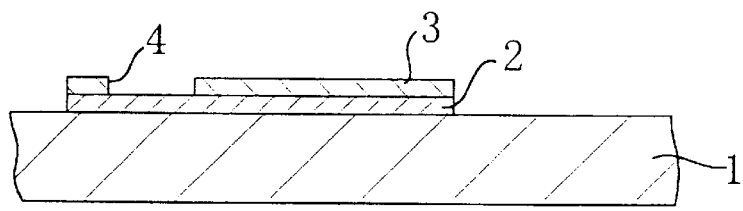
Figure 3C:
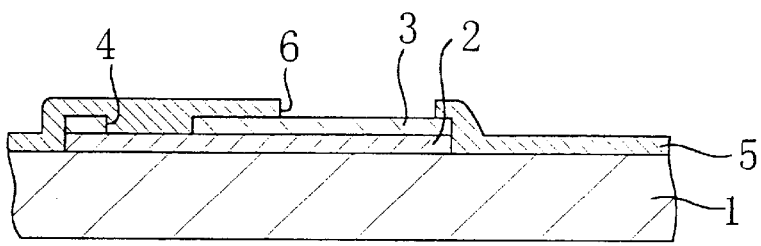

Next, in the step shown in FIG. 3(b), the dielectric film 3a is etched selectively to form the first aperture 4 reaching the first metal film 2a. Then, the first metal film 2a and the dielectric film 3a are patterned by etching using a photoresist mask (not shown) covering a region to be formed with the capacitance element including the first aperture 4, thereby forming the lower electrode 2 and the capacitance insulating film Next, in the step shown in FIG. 3(c), the passivation insulating film 5 is deposited on the substrate and the second aperture 6 is formed in the passivation insulating film 5 to expose the capacitance insulating film 3 except for a region in the vicinity of the outer circumference thereof.

Figure 3D:
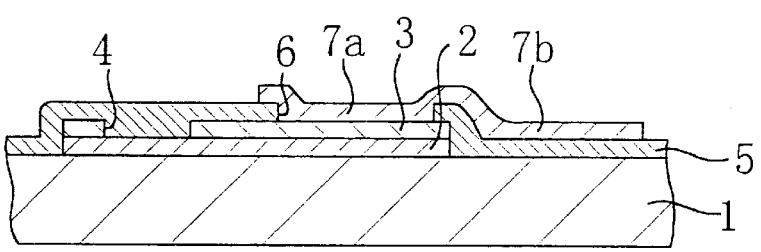

Next, in the step shown in FIG. 3(d), a second metal film (not shown) for the upper electrode is deposited by sputtering on the substrate. The second metal film is then patterned to form the first partial film 7a to be filled in the second aperture 6 and the second partial film 7b which is not in contact with the capacitance insulating film 3 and extending continually from the first partial film 7a to overlie the region of the substrate 1 in non-overlapping relation with the capacitance insulating film 3 when viewed in plan view.

Figure 3E:
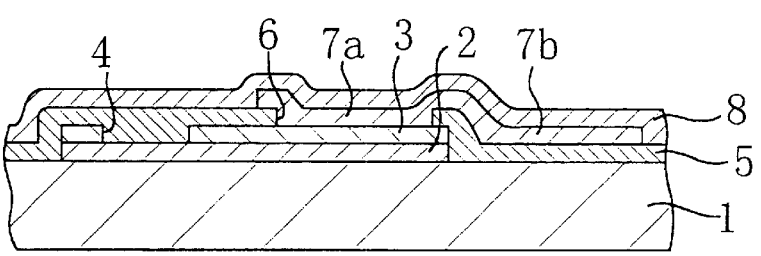

Next, in the step shown in FIG. 3(e), the interlayer insulating film 8 is deposited on the substrate, followed by the first contact hole 9a formed to extend through the interlayer insulating film 8 and the passivation insulating film 5 to reach the lower electrode 2 and the second contact hole 9b formed to extend through the interlayer insulating film 8 to reach the second partial film 7b.

Figure 3F:
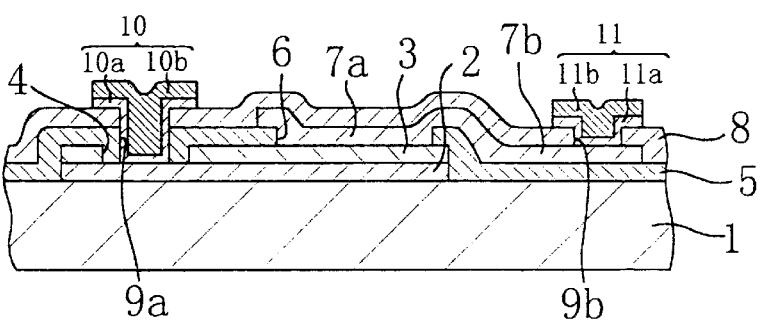
Figure 4:
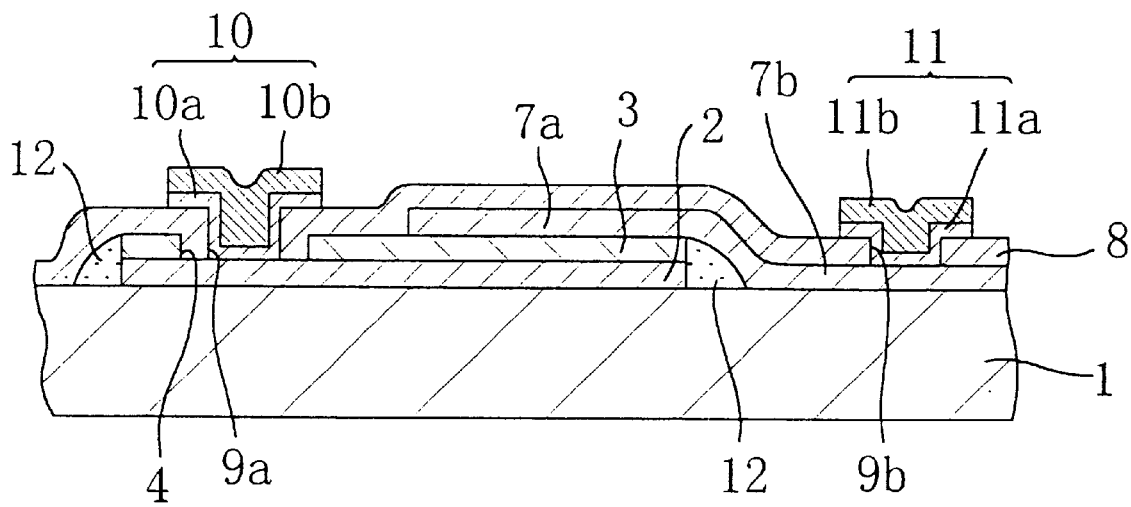
FIG. 4 is a cross-sectional view showing a structure in the vicinity of a capacitance element according to a second embodiment.

Next, in the step shown in FIG. 3(f), the titanium film and the aluminum alloy film are deposited sequentially on the substrate and patterned to form the first electrode wire 10 filled in the first contact hole 9a and the second electrode wire 11 filled in the second contact hole 9b. The resulting first and second electrode wires 10 and 11 consist of the respective lower-layer films 10a and 11a each composed of the titanium film and the respective upper-layer films 10b and 11b each composed of the aluminum alloy film.

Although the present embodiment has formed the first aperture 4 in the capacitance insulating film 3 in the step shown in FIG. 3(b), it is also possible to perform only the patterning of the respective outer circumferential portions of the capacitance insulating film 3 and the lower electrode 2 and then form the first contact hole 9a extending.,through the interlayer insulating film 8, the passivation insulating film 5, and the capacitance insulating film 3 in the step shown in FIG. 3(f).

In the case where the capacitance element is formed in an integrated circuit, the first and second electrode wires 10 and 11 constitute a part of a wiring layer in the integrated circuit and therefore formed in the same process as the wiring layer.

According to the present embodiment, the upper electrode 7 is composed of the first partial film 7a which is in contact with the capacitance insulating film 3 and the second partial film 7b which is not in contact with the capacitance insulating film so that the second electrode wire 11 is in contact with the second partial film 7b. Consequently, even if titanium or the like composing the second electrode wire 11 encroaches into the second partial film 7b of the upper electrode 7, it is difficult for titanium or the like to diffuse from the second partial film 7b into the first partial film 7a through the upper electrode 7 and reach the capacitance insulating film 3 during thermal treatment, so that degradation of the performance of the capacitance insulating film 3 resulting from the reaction between titanium or the like and a ferroelectric material is prevented.

In the structure according to the present embodiment shown in FIGS. 1 and 2, in particular, the second partial film 7b has the region in non-overlapping relation with the capacitance insulating film 3 when viewed in plan view so that the second electrode wire 11 is in contact with the region of the second partial film 7b in non-overlapping relation with the capacitance insulating film 3 when viewed in plan view. Accordingly, the distance between the contact point with the second electrode wire 11 and the contact point with the capacitance insulating film 3 in the upper electrode 7 can be increased easily and satisfactorily, so that the upper electrode 7 having the aforesaid function of excellently inhibiting the encroachment of titanium or the like into the capacitance insulating film 3 is obtained advantageously.

Moreover, since the present embodiment has formed the first partial film 7a in the second aperture 6 serving as the capacitance determining aperture, the region of the capacitance insulating film 3 in the vicinity of the outer circumference thereof, which is susceptible to an influence exerted by peripheral members, does not function as the capacitance film. Consequently, the properties of the capacitance element are excellently retained, which facilitates the achievement of an accurate capacitance value as designed.

In the present embodiment, each of the metal films composing the upper and lower electrodes 7 and 2 can be composed of either a single-layer film of platinum, iridium, palladium, or ruthenium or an alloy film containing two or more of the metals. Alternatively, a multilayer film consisting of two or more of a platinum film, an iridium film, a palladium film, and a ruthenium film may also be used instead. However, the first metal film 2a need not necessarily be a metal film such as a platinum film but may be a polysilicon film, as will be described later.

In the case where the second metal film 7 is composed of a metal film such as a platinum film formed by sputtering, in particular, there is substantially no grain boundary extending in the lateral direction, since the second metal film 7 has a columnar crystal structure extending in the vertical direction. However, since titanium diffuses mainly through the grain boundary, titanium or the like that has encroached from the second electrode wire 11 into the second partial film 7b seldom diffuses in the lateral direction to reach the first partial film 7a. Consequently, the degradation of the properties of the capacitance element resulting from the encroachment of titanium or the like into the capacitance insulating film 3 can be prevented positively.

The capacitance insulating film 3 may be made of a ferroelectric material composed of a first oxide containing strontium, bismuth, or tantalum as a main component, a ferroelectric material composed of a second oxide containing lead, zircon, or titanium as a main component, or a composite dielectric material composed of the first and second oxides. Since these oxides are ferroelectric materials and provide large capacitance even in a small area, they are suitable for the achievement of higher integration and exhibit excellent properties such as low operating voltage and high-speed wiring and reading operations when used in a memory.

Preferably, the interlayer insulating film 8 is composed of anyone of a silicon oxide film, a silicon oxide film containing boron and phosphorus, and a silicon oxide film containing phosphorus. This implements an interlayer insulating film with excellent flatness and a more stable capacitance element with a longer life.

Embodiment 2

FIG. 3 is a cross-sectional view showing only a principal portion of a capacitance element according to a second embodiment.

As shown in the drawing, a lower electrode 2 is formed on a substrate 1 (such as a silicon substrate). A capacitance insulating film 3 having substantially the same outer circumferential configuration as the lower electrode 2 is formed on the lower electrode 2. Insulator sidewalls 12 are formed on the respective side faces of the lower electrode 2 and the capacitance insulating film 3. Preferably, the top surface of each of the insulator sidewalls 12 is not higher in level than that of the capacitance insulating film 3. The capacitance insulating film 3 is formed with a first aperture 4 reaching the lower electrode 2. An upper electrode 7 is provided extensively over the capacitance insulating film 3, the insulator sidewalls 12, and the substrate 1, with a starting point lying on the capacitance insulating film 3. The upper electrode 7 has a first partial film 7a which is in contact with approximately half the top surface of the capacitance insulating film 3 and a second partial film 7b which is not in contact with the capacitance insulating film 3. The first partial film 7a of the upper electrode 7, the lower electrode 2, and the capacitance insulating film 3 constitute a MIM capacitance element. In the present embodiment also, the second partial film 7b has a region in non-overlapping relation with the capacitance insulating film when viewed in plan view.

An interlayer insulating film 8 is formed over the first and second partial films 7a and 7b to cover the whole substrate. A first contact hole 9a is formed to extend through the interlayer insulating film 8 including the portion provided within the first aperture 4 to reach the lower electrode 2. A second contact hole 9b is formed to extend through the interlayer insulating film 8 to reach the region of the second partial film 7b in non-overlapping relation with the capacitance insulating film when viewed in plan view. A first electrode wire 10 is provided within the first contact hole 9a and on the portion of the interlayer insulating film 8 surrounding the first contact hole 9a. A second electrode wire 11 is provided within the second contact hole 9b and on the portion of the interlayer insulating film 8 surrounding the, second contact hole 9b. The first and second electrode wires 10 and 11 are composed of respective two-layer films consisting of respective lower-layer films 10a and 11a each made of titanium and respective upper-layer films 10b and 11b each made of an aluminum alloy film.

It follows therefore that, in the second embodiment also, the second electrode wire 11 is connected to the region of the second partial film 7b of the upper electrode 7 in non-overlapping relation with the capacitance insulating film when viewed in plan view.

A description will be given next to the process of manufacturing the capacitance element according to the present embodiment. FIGS. 5(a) to 5(d) are cross-sectional views illustrating the first-half steps of the manufacturing process and FIGS. 6(a) to 6(d) are cross-sectional views illustrating the second-half steps of the manufacturing process.

Figure 5A:
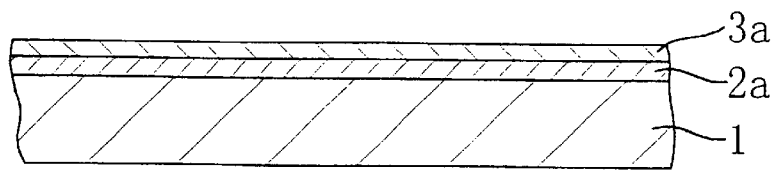
FIGS. 5(a) to 5(d) are cross-sectional views illustrating the first-half steps of the process of manufacturing the capacitance element according to the second embodiment.

First, in the step shown in FIG. 5(a), a first metal film 2a and a dielectric film 3a are formed on the main surface of the substrate 1.

Figure 5B:
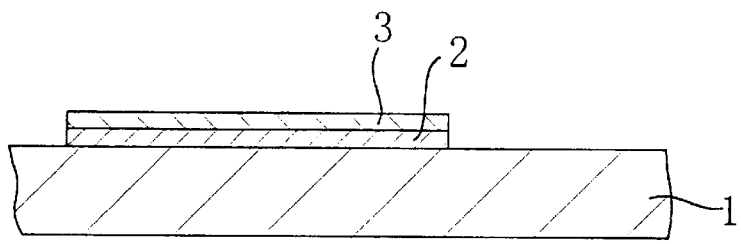

Next, in the step shown in FIG. 5(b), the first metal film 2a and the dielectric film 3a are patterned by etching using a photoresist mask (not shown) covering a region to be formed with the capacitance element to form the lower electrode 2 and the capacitance insulating film 3 having the same outer circumferential configuration as the lower electrode 2. The second embodiment is different from the first embodiment in that the capacitance insulating film 3 is not formed with an aperture.

Figure 5C:
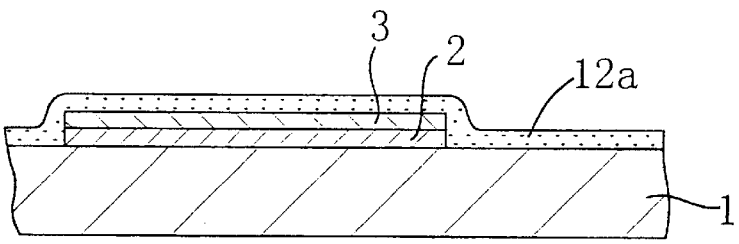

Next, in the step shown in FIG. 5(c), an insulating film 12a such as a silicon oxide film is deposited on the substrate.

Figure 5D:
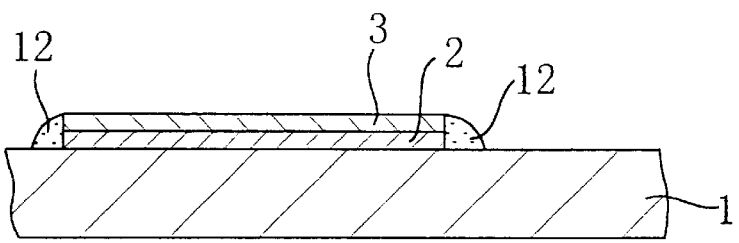

Next, in the step shown in FIG. 5(d), anisotropic etching is performed with respect to the entire surface of the insulating film 12 to leave the insulator sidewalls 12 on the respective side faces of the capacitance insulating film 3 and the lower electrode 2. In this step, it is important to completely remove the insulating film 12a from the capacitance insulating film 3.

Figure 6A:
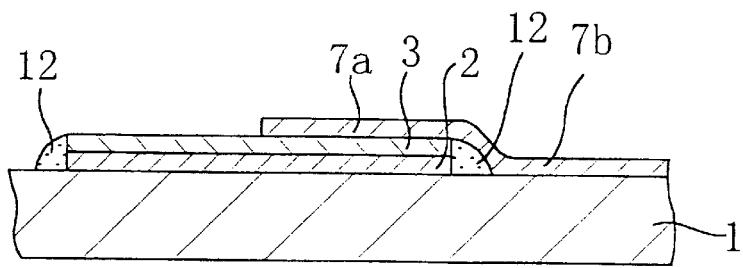
FIGS. 6(a) to 6(d) are cross-sectional views illustrating the second-half steps of the process of manufacturing the capacitance element according to the second embodiment.

Next, in the step shown in FIG. 6(a), a second metal film (not shown) for the upper electrode is formed on the substrate. Then, the second metal film is patterned to form the first partial film 7a overlying the capacitance insulating film 3 and the second partial film 7b which is not in contact with the capacitance insulating film 3 and extending continually from the first partial film 7a to overlie the region of the substrate 1 in non-overlapping relation with the capacitance insulating film 3 when viewed in plan view.

Figure 6B:
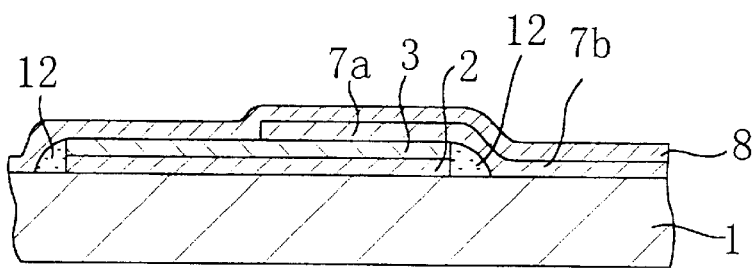
Figure 6C:
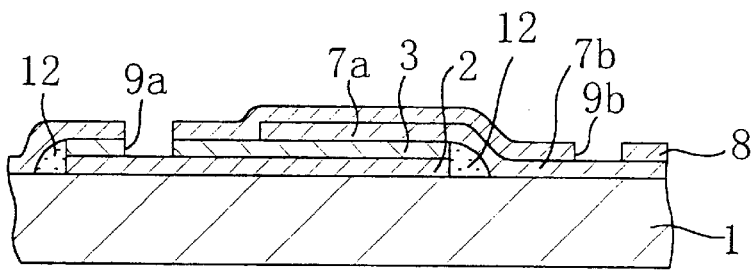

Next, in the step shown in FIG. 6(b), the interlayer insulating film 8 is formed on the substrate. Then, in the step shown in FIG. 6(c), the first contact hole 9a is formed to extend through the interlayer insulating film 8 and the capacitance insulating film 3 to reach the lower electrode 2, while the second contact hole 9b is formed to extend through the interlayer insulating film 8 to reach the region of the second partial film 7b in non-overlapping relation with the capacitance insulating film when viewed in plan view.

Figure 6D:
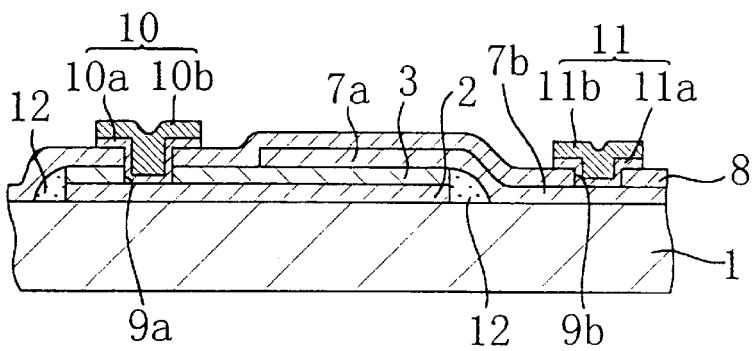

Thereafter, in the step shown in FIG. 6(d), a titanium film and an aluminum alloy film are deposited sequentially on the substrate and patterned to form the first electrode wire 10 filled in the first contact hole 9a and the second electrode wire 11 filled in the second contact hole 9b. The resulting first and second electrode wires 10 and 11 consist of the respective lower-layer films 10a and 11a each composed of the titanium film and the respective upper-layer films 10b and 11b each composed of the aluminum alloy film.

In the case where the capacitance element is formed in the integrated circuit, the first and second electrode wires 10 and 11 constitute a part of a wiring layer in the integrated circuit and therefore formed in the same process as the wiring layer.

In the present embodiment also, the upper electrode 7 is composed of the first partial film 7a which is in contact with the capacitance insulating film 3 and the second partial film 7b which is not in contact with the capacitance insulating film 3 so that the second electrode wire 11 is in contact with the region of the second partial film 7b in non-overlapping relation with the capacitance insulating film 3 when viewed in plan view. Under the same action as implemented in the first embodiment, therefore, the degradation of the performance of the capacitance insulating film 3 resulting from the reaction between titanium and the ferroelectric material can be prevented positively.

Additionally, the present embodiment has formed the insulator sidewalls 12 on the respective side faces of the capacitance insulating film 3 and the lower electrode 2. Since the upper electrode 7 has been formed smoothly extensively over the capacitance insulating film 3, the insulator sidewalls 12, and the substrate 11, disconnection between the capacitance insulating film 3 and the lower electrode 2 at the end portion thereof can be prevented.

In the present embodiment also, the various materials used to compose the upper and lower electrodes 7 and 2, the capacitance insulating film 3, and the interlayer insulating film 8 in the first embodiment can be used similarly.

Preferably, the insulator sidewalls are composed of any one of a silicon oxide film, a silicon oxide film containing boron and phosphorus, and a silicon oxide film containing phosphorus. This smoothes away a stepped portion formed between the capacitance insulating film and the lower electrode.

Embodiment 3

Figure 7:
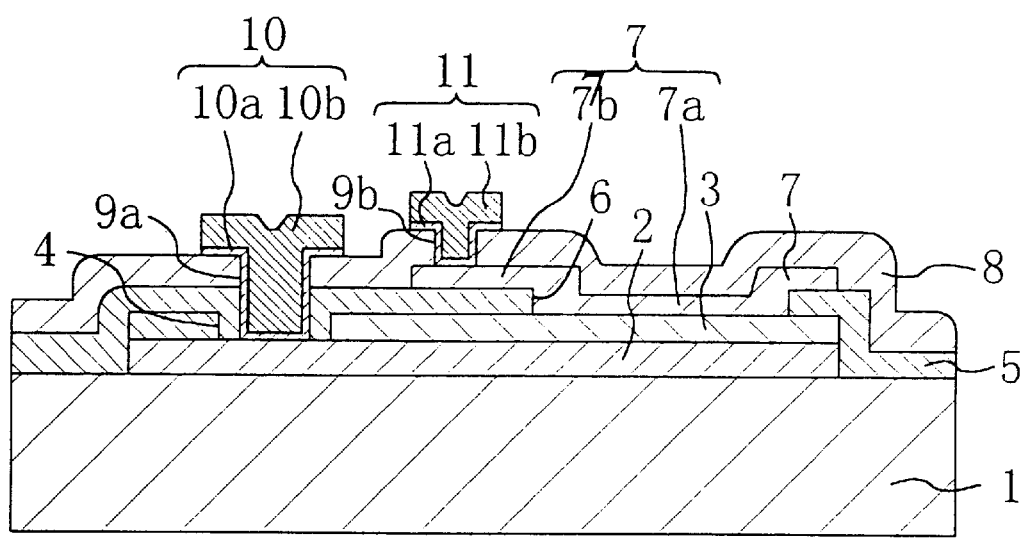
FIG. 7 is a cross-sectional view showing a structure in the vicinity of a capacitance element according to a third embodiment.
Figure 8:
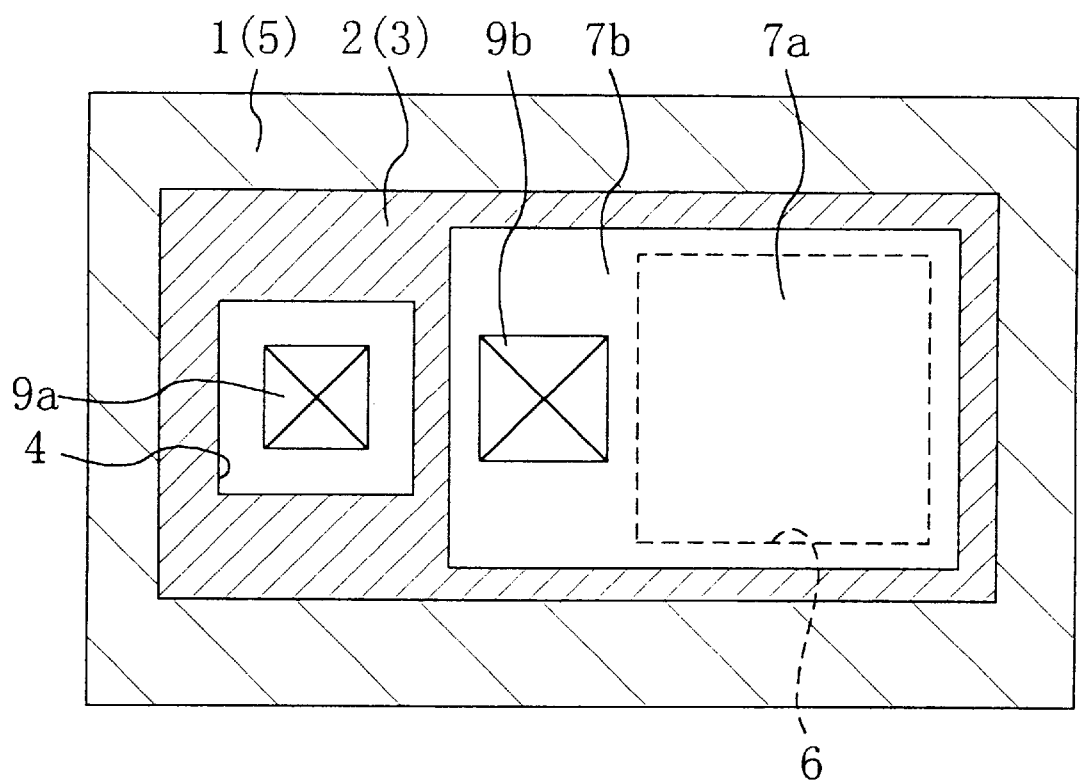
FIG. 8 is a plan view showing the structure in the vicinity of the capacitance element according to the third embodiment.
Figure 9:
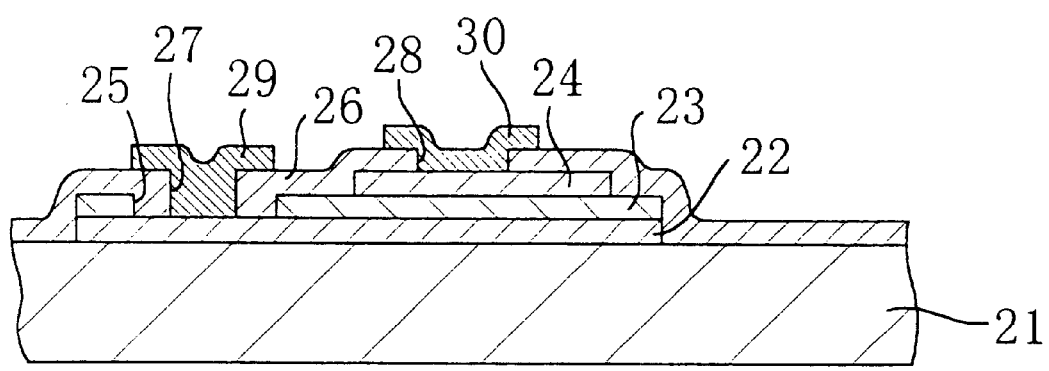
FIG. 9 is a cross-sectional view showing a structure in the vicinity of a conventional capacitance element.
Figure 10A:
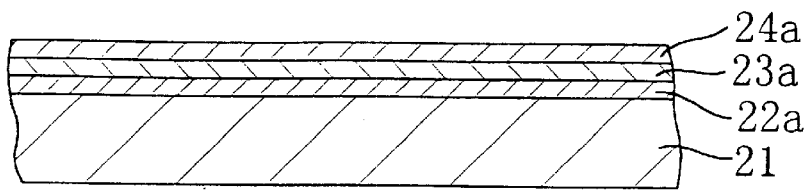
FIGS. 10(a) to 10(e) are cross-sectional views illustrating the process of manufacturing the conventional capacitance element.
Figure 10B:
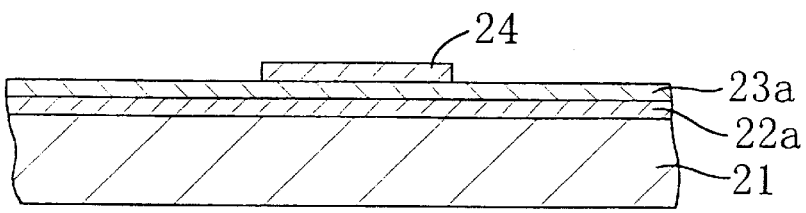
Figure 10C:
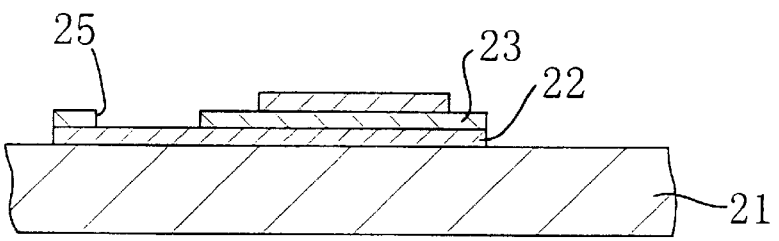
Figure 10D:
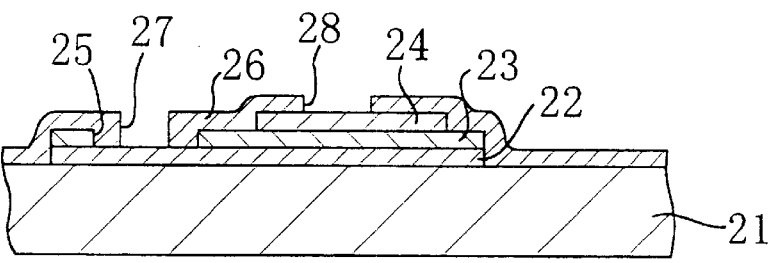
Figure 10E:
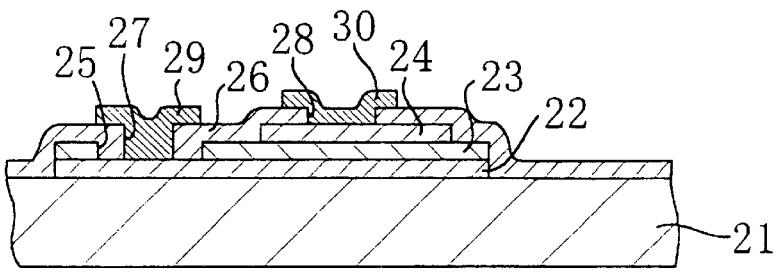

FIGS. 7 and 8 are a cross-sectional view and a plan view showing only a principal portion of a capacitance element according to a third embodiment. It is to be noted that the drawing of an interlayer insulating film and electrode wires is omitted in FIG. 8. A lower electrode 2 is formed on a substrate 1 (such as a silicon substrate). A capacitance insulating film 3 is formed on the lower electrode 2. The capacitance insulating film 3 is formed with a first aperture 4 reaching the lower electrode 2. A passivation insulating film 5 is formed on the capacitance insulating film 3. The passivation insulating film 5 is formed with a second aperture (capacitance determining aperture) 6 reaching the capacitance insulating film 3. A first partial film 7a of the upper electrode 7 is formed to fill in the second aperture 6. The lower electrode 2, the capacitance insulating film 3, and the first partial film 7a constitute a MIM capacitance element.

A second partial film 7b of the upper electrode 7 is provided on the passivation insulating film 5. The second partial film 7b is formed in the region where it is kept from contact with the capacitance insulating film 3 and extends continually from the first partial film 7a filled in the second aperture 6. In particular, the second partial film 7b according to the present embodiment has a region positioned above the capacitance insulating film 3, i.e., a region in overlapping relation with the capacitance insulating film when viewed in plan view. An interlayer insulating film 8 is formed over the first and second partial films 7a and 7b to cover the whole substrate. A first contact hole 9a is formed through the interlayer insulating film 8 and the passivation insulating film 5 filled in the first aperture 4 to reach the lower electrode 2. A second contact hole 9b is formed through the interlayer insulating film 8 to reach the region of the second partial film 7b in overlapping relation with the capacitance insulating film 3 when viewed in plan view. A first electrode wire 10 is formed in the first contact hole 9a and on the portion of the interlayer insulating film 8 surrounding the first contact hole 9a. A second electrode wire 11 is formed in the second contact hole 9b and on the portion of the interlayer insulating film 8 surrounding the second contact hole 9b. The first and second electrode wires 10 and 11 are composed of respective two-layer films consisting of respective lower-layer films 10a and 11a each made of titanium and respective upper-layer films 10b and 11b each made of an aluminum alloy film.

It follows therefore that, in the capacitance element according to the present embodiment, the second electrode wire 11 is connected to the region of the second partial film 7b of the upper electrode 7 in overlapping relation with the capacitance insulating film. The passivation insulating film 5 according to the present embodiment functions not only as a capacitance determining insulating film for determining the capacitance of the capacitance element but also as an underlying insulating film for the second partial film 7b of the upper electrode 7.

In the present embodiment also, the upper electrode 7 is composed of the first partial film 7a which is in contact with the capacitance insulating film 3 and the second partial film 7b which is not in contact with the capacitance insulating film 3. Under the same action as implemented in the first embodiment, therefore, the degradation of the performance of the capacitance insulating film 3 resulting from the reaction between titanium and the ferroelectric material can be prevented.

Additionally, the second electrode wire 11 is in contact with the region of the second partial film 7b which is in overlapping relation with the capacitance insulating film 3 when viewed in plan view. As a result, a space above the capacitance insulating film 3 can be used effectively in providing a contact point between the upper electrode 7 and the second electrode wire 11, resulting in a further miniaturized capacitance element.

Other Embodiments

Although each of the foregoing embodiments has composed the lower electrode of the platinum film or the like, the present invention is not limited thereto. The lower electrode may also be composed of a polysilicon film, an aluminum alloy film, or the like. Although each of the foregoing embodiments has provided a non-conductive region (semiconductor substrate) immediately under the lower electrode, the present invention is not limited thereto. Source and drain regions may also be formed by diffusing an impurity into the semiconductor substrate to immediately underlie the lower electrode.

For example, the capacitance element according to the present invention can be used without any modification as the capacitance element of a stacked DRAM by considering a storage node and a cell plate disposed in the memory cell transistor of the stacked DRAM to be the lower and upper electrodes of the capacitance element according to the present invention. In that case, the storage node is formed on the source region of the semiconductor substrate.

It is also possible to impart a MIS capacitor structure to the capacitance element. In that case, the lower electrode may be a high-concentration impurity diffusion region in the semiconductor substrate.

In the structure of the capacitance element having the capacitance determining aperture (second aperture 6) according to the first and third embodiments shown in FIGS. 1 and 7, the insulator sidewalls may also be formed on the respective side faces of the outer circumferential portions of the capacitance insulating film 3 and the lower electrode 2. In that case, the insulator sidewalls are also formed on the respective side faces of the inner circumferential portions of the second aperture 6 of the passivation insulating film 5, so that discontinuation of the upper electrode 7 at the stepped portion is prevented advantageously.

What is claimed is:

1. A method of manufacturing a capacitance element, comprising:
    a first step of sequentially forming a conductor film and a dielectric film on a substrate;
    second step of patterning said conductor film and said dielectric film to form a lower electrode and a capacitance insulating film;
    a third step of forming a metal film for an upper electrode on the substrate so that said metal film for an upper electrode is not in contact with said conductor film for said lower electrode;
    a fourth step of patterning said metal film for an upper electrode to form an upper electrode having a first partial film which is in contact with a top surface of said capacitance insulating film and a second partial film which is not in contact with said capacitance insulating film;
    a fifth step of forming an interlayer insulating film on the substrate;
    a sixth step of forming a contact hole extending through said interlayer insulating film and reaching the second partial film of said upper electrode; and
    a seventh step of depositing a metal film for a wire on the substrate and patterning the metal film for a wire to form an electrode wire provided in said contact hole and connected to said second partial film of said upper electrode.

2. A method of manufacturing a capacitance element according to claim 1, wherein
    said second step includes etching said conductor film and said dielectric film by using a common mask member to form the lower electrode and the capacitance insulting film having substantially the same outer circumferential configuration as the lower electrode, said method further comprising the step of
    depositing an insulating film for sidewalls on the substrate and performing anisotropic etching with respect to the insulating film for sidewalls to form insulator sidewalls on respective end faces of respective outer circumferential portions of said capacitance insulating film and said lower electrode, wherein
        said fourth step includes forming the second partial film of said upper electrode over a region of said substrate including said insulator sidewalls.

3. A method of manufacturing a capacitance element according to claim 1, wherein said step of forming the metal film for an upper electrode is performed by sputtering.

4. A method of manufacturing a capacitance element, comprising:
    a first step of sequentially forming a conductor film and a dielectric film on a substrate;
    a second step of patterning said conductor film and said dielectric film to form a lower electrode and a capacitance insulating film;
    a third step of forming an underlying insulating film on the substrate;
    a fourth step of partially removing said underlying insulating film to expose a part of said capacitance insulating film;
    a fifth step of forming a metal film for an upper electrode on the substrate;
    a sixth step of patterning said metal film for an upper electrode to form an upper electrode having a first partial film which is in contact with a top surface of the exposed region of said capacitance insulating film;
    a seventh step of forming an interlayer insulating film on the substrate;
    an eighth step of forming a contact hole extending through said interlayer insulating film and reaching the second partial film of said upper electrode; and a ninth step of depositing a metal film for a wire on the substrate and patterning the metal film for a wire to form an electrode wire filled in said contact hole and connected to said second partial film of said upper electrode.

5. A method of manufacturing a capacitance element according to claim 4, wherein said fourth step includes removing a region of said underlying insulating film positioned above a main region of said capacitance insulating film except for a region of said capacitance insulating film in the vicinity of an outer circumference thereof to form a capacitance determining aperture and said sixth step includes forming the second partial film of said upper electrode in said capacitance determining aperture.

6. A method of manufacturing a capacitance element according to claim 4, wherein said sixth step includes forming the second partial film of said upper electrode on a region of said substrate in non-overlapping relation with said capacitance insulating film.

7. A method of manufacturing a capacitance element according to claim 4, wherein said sixth step includes forming the second partial film of said upper electrode on a region of said underlying insulating film in overlapping relation with said capacitance insulating film.

8. A method of manufacturing a capacitance element according to claim 4, wherein said step of forming the metal film for an upper electrode is performed by sputtering.

* * * * *